(12) United States Patent
Kim et al.

(10) Patent No.: US 10,272,511 B2
(45) Date of Patent: Apr. 30, 2019

(54) FLUX COMPOSITION CONTAINING CARBON COMPONENT, SOLDER PASTE CONTAINING THE SAME, AND SOLDERING METHOD

(71) Applicant: Hyundai Motor Company, Seoul (KR)

(72) Inventors: Jeejung Kim, Yongin-si (KR); Min Gun Jeong, Seoul (KR)

(73) Assignee: Hyundai Motor Company, Seoul (KR)

( * ) Notice: Subject to any disclaimer, the term of this patent is extended or adjusted under 35 U.S.C. 154(b) by 328 days.

(21) Appl. No.: 15/348,787

(22) Filed: Nov. 10, 2016

(65) Prior Publication Data

US 2018/0056422 A1    Mar. 1, 2018

(30) Foreign Application Priority Data

Aug. 30, 2016 (KR) ........................ 10-2016-0110843

(51) Int. Cl.
| | | |
|---|---|---|
| B23K 1/00 | (2006.01) | |
| B23K 1/20 | (2006.01) | |
| B23K 35/02 | (2006.01) | |
| B23K 35/26 | (2006.01) | |
| B23K 35/36 | (2006.01) | |
| B23K 35/362 | (2006.01) | |
| H05K 3/26 | (2006.01) | |
| H05K 3/34 | (2006.01) | |
| B23K 101/42 | (2006.01) | |

(52) U.S. Cl.
CPC ............ *B23K 1/0016* (2013.01); *B23K 1/203* (2013.01); *B23K 35/025* (2013.01); *B23K 35/0227* (2013.01); *B23K 35/262* (2013.01); *B23K 35/3601* (2013.01); *B23K 35/362* (2013.01); *B23K 35/3613* (2013.01); *B23K 35/3618* (2013.01); *H05K 3/26* (2013.01); *H05K 3/3489* (2013.01); *B23K 2101/42* (2018.08); *H05K 3/3484* (2013.01)

(58) Field of Classification Search
None
See application file for complete search history.

(56) References Cited

FOREIGN PATENT DOCUMENTS

| | | |
|---|---|---|
| JP | 2008-205453 A | 9/2008 |
| JP | 2014-124657 A | 7/2014 |
| JP | 2016-032817 A | 3/2016 |
| KR | 10-2006-0032185 A | 4/2006 |
| KR | 10-2011-0119444 A | 11/2011 |
| WO | WO 2015/193684 A1 | 12/2015 |

*Primary Examiner* — Jenny R Wu

(74) *Attorney, Agent, or Firm* — Morgan, Lewis & Bockius LLP

(57) ABSTRACT

A soldering flux composition containing a resin, a solvent, and carbon particles is provided herein.

6 Claims, 3 Drawing Sheets

FLUX COMPOSITION CONTAINING CARBON COMPONENT, SOLDER PASTE CONTAINING THE SAME, AND SOLDERING METHOD

CROSS-REFERENCE TO RELATED APPLICATION

The present application claims priority to and the benefit of Korean Patent Application No. 10-2016-0110843 filed on Aug. 30, 2016, the entire contents of which are incorporated herein by reference.

BACKGROUND OF THE INVENTION

Field of the Invention

The present invention relates to a flux composition containing a carbon component, a solder paste containing the same, and a soldering method.

Description of Related Art

As a soldering material, a solder has been mainly used, but the use of the solder in electronic products has been banned due to recent environmental regulations. For example, in the vehicle field, the use of a lead component in vehicles is scheduled to be strictly banned by 2016. Therefore, an existing soldering material based on a lead component, used in the related art must be replaced with various kinds of metal alloys.

However, a lead-free soldering material has disadvantages in that is has weaker strength than existing lead alloy based soldering materials and is vulnerable to corrosion. Also an ion migration phenomenon may easily occur.

Due to increases in its application and in the use amount of a novel lead-free solder, research into a technology for improving reliability of the lead-free solder has been conducted. Methods of improving reliability of the lead-free solder have been tested including:

a method of suppressing growth of a grain boundary of a solder alloy by thermal fatigue, a method of suppressing corrosion of a surface of a solder, a method of suppressing growth of an intermetallic compound formed between a substrate and a solder, a method of improving strength of a solder by solid solution strengthening, and the like.

For instance, a method of improving strength and reliability against thermal fatigue may include adjusting an alloy phase. Various advantages such as solid-solution strengthening of the solder alloy, grain boundary refinement, a change in melting point, and the like, may also be implemented into the method as described above.

Since the process of designing the solder alloy may improve the physical properties of the final product, this process is generally used at the time of preparing a solder.

However, even when an alloy is designed, the performance of the alloy may not be comparable or equivalent to the performance of a solder material containing a lead component. This may be mainly caused by a lack of technology capable of suppressing strength deterioration, corrosion, and the ion migration phenomenon of the solder alloy.

Methods of adding particles having a nano size to a solder alloy has been tested, and a technology capable of improving physical properties of a solder such as strength of the solder, suppression of growth of an intermetallic compound, and the like has been developed.

However, the solder prepared according to this method has disadvantages. For instance, it is difficult to disperse nanoparticles, and dispersibility of the dispersed nanoparticles is not maintained at the time of soldering (i.e., soldering by heat treatment).

Methods of dispersing carbon nanotubes in a solder using a ball miller have been suggested. More specifically, a method of adding the carbon nanotubes to a solder solution using an ultrasonic homogenizer to obtain a solder in which a carbon component (the carbon nanotube) is dispersed has been suggested.

However, when mixing the solder and the carbon nanotubes, it is difficult to disperse the carbon nanotubes due to a specific gravity difference. Also, it is impossible to obtain the desired performance due to a phase separation generated between the carbon nanotubes and the solder during the process.

Further, at the time of preparing the solder, it may be desirable that the liquid phase solder and the carbon nanotubes contact each other to be mixed with each other. Yet, in the method described above, this preparation may be significantly difficult. because the carbon nanotubes form aggregates. In other words, when the carbon nanotubes and the solder contact each other, the carbon nanotubes are attached to the solder, such that a large amount of carbon nanotubes that are not actually attached are highly likely to be aggregated.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a soldering flux composition having advantages of improving mechanical/electrical properties of a solder by adding carbon particles to a flux composition added at the time of preparing a solder paste or solder wire.

In addition, various aspects of the present invention are directed to providing a solder paste or solder wire containing the soldering flux composition as described above.

Further, various aspects of the present invention are directed to providing a soldering method using the solder paste as described above.

An exemplary embodiment of the present invention provides a soldering flux composition containing a resin, a solvent, and carbon particles.

The resin may be rosin, a rosin derivative, an acrylic resin, a styrene-maleic acid resin, an epoxy resin, a urethane resin, a polyester resin, a phenoxy resin, a terpene resin, a polyethylene resin, a polypropylene resin, a poly vinyl alcohol resin, a polyvinylidene chloride resin, or a combination thereof.

The resin may be tall oil rosin, gum rosin, wood rosin, or a combination thereof.

The resin may be hydrogenated rosin, polymerized rosin, non-uniform rosin, acrylic acid modified rosin, maleic acid modified rosin, or a combination thereof.

The resin may be a polymer or copolymer of a monomer selected from (meth)acrylic acid, itaconic acid, maleic acid, crotonic acid, octyl (meth)acrylate, nonyl (meth)acrylate, decyl (meth)acrylate, undecyl (meth)acrylate, dodecyl (meth)acrylate, tridecyl (meth)acrylate, tetradecyl (meth)acrylate, lauryl (meth)acrylate, stearyl (meth)acrylate, methyl (meth)acrylate, ethyl (meth)acrylate, butyl (meth) acrylate, hexyl (meth)acrylate, and propyl (meth)acrylate.

The solvent may be isopropyl alcohol, ethanol, acetone, toluene, xylene, ethyl acetate, ethylcellosolve, butylcellosolve, glycol ether, hexyldiglycol, (2-ethylhexyl)diglycol, phenyl glycol, butyl carbitol, octanediol, α-terpineol, β-terpineol, tetraethylene glycol dimethyl ether, trimellitic acid tris(2-ethylhexyl), sebacic acid bis(2-ethylhexyl), or a combination thereof.

The carbon particles may be carbon nanotubes, graphene, fullerenes, nanodiamond, carbon black, or a combination thereof.

The soldering flux composition may contain from about 30 wt % to about 50 wt % (e.g., about 30 wt %, 33 wt %, 35 wt %, 37 wt %, 40 wt %, 43 wt %, 45 wt %, 47 wt %, or about 50 wt %) of the resin and from about 0.5 wt % to about 30 wt % (e.g., about 0.5 wt %, 1 wt %, 5 wt %, 10 wt %, 15 wt %, 20 wt %, 25 wt %, 29 wt %, or about 30 wt %) of the carbon particles, the remainder being the solvent.

Another embodiment of the present invention provides a preparation method of a soldering flux composition including: mixing a flux with a solvent to prepare a liquid phase mixture; preparing carbon particles having an activated surface; and dispersing the carbon particles in the liquid phase mixture.

The preparing of the carbon particles having the activated surface may include exposing surfaces of the carbon particles to ultraviolet (UV) light or radiation.

The preparing of the carbon particles having the activated surface may include performing acid treatment on surfaces of the carbon particles.

The preparing of the carbon particles having the activated surface may include performing ultrasonic treatment on surfaces of the carbon particles.

Yet another embodiment of the present invention provides a solder mixture containing the flux composition as described above and a solder.

The solder mixture may be a solder paste or solder wire.

The solder may be made of a tin-silver-copper alloy, a tin-silver alloy, a tin-copper alloy, a tin-antimony alloy, a tin-bismuth alloy, or a tin-indium alloy.

The solder may not contain carbon.

Yet another embodiment of the present invention provides a soldering method including: printing the solder mixture as described above on a circuit board; curing the solder mixture; coating an electrolyte resin on a surface of the cured solder mixture; and performing heat treatment on the cured solder mixture.

The curing of the solder mixture may be performed at a range from about 200° C. to about 250° C. (e.g., about 200° C., 210° C., 215° C., 220° C., 225° C., 230° C., 235° C., 240° C., 245° C., or about 250° C.) for from about 5 hours to about 6 hours (e.g., about 5 hours, 5.5 hours or about 6 hours).

In the coating of the electrolyte resin, the electrolyte resin may be poly(diallyldimethylammonium chloride), poly(allylamine), poly(ethyleneimine), or poly(acrylamide-co-diallyldimethylammonium).

In the coating of the electrolyte resin, the electrolyte resin may be coated at a thickness of from about 100 μm to about 500 μm (e.g., about 100 μm, 130 μm, 150 μm, 200 μm, 250 μm, 270 μm, 300 μm, 350 μm, 400 μm, 410 μm, 430 μm, 450 μm, 480 μm, or about 500 μm).

The soldering method may further include, after the coating of the electrolyte resin, washing the surface of the solder mixture.

The heat treatment may be performed at from about 50° C. to about 100° C., (e.g., about 50° C., 60° C., 70° C., 80° C., 90° C., or about 100° C.) for from about 10 minutes to about 3 hours (e.g., about 10 minutes, 30 minutes, 1 hour, 1.5 hours, 2 hours, 2.5 hours, about 3 hours).

According to an embodiment of the present invention, in the soldering flux composition, the carbon particles contained in the flux composition are mixed with a metal alloy forming the solder, thereby making it possible to strengthen mechanical strength of the solder due to a peening effect.

According to the embodiment of the present invention, in the soldering flux composition, the carbon particles remaining in a grain boundary of a metal inhibit growth of a grain by heat, deterioration of strength due to thermal fatigue of the metal may be decreased. That is, durability may be improved.

According to the embodiment of the present invention, in the soldering flux composition, a coating film may be formed on a surface of a metal by the carbon particles existing on the surface of the cured solder mixture, thereby making it possible to prevent oxidation and corrosion of the solder.

According to the embodiment of the present invention, in the soldering flux composition, metal diffusion or ion movement may be restricted by carbon particles distributed on the surface of the cured solder mixture, thereby making it possible to suppress a migration phenomenon from occurring between the solders.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
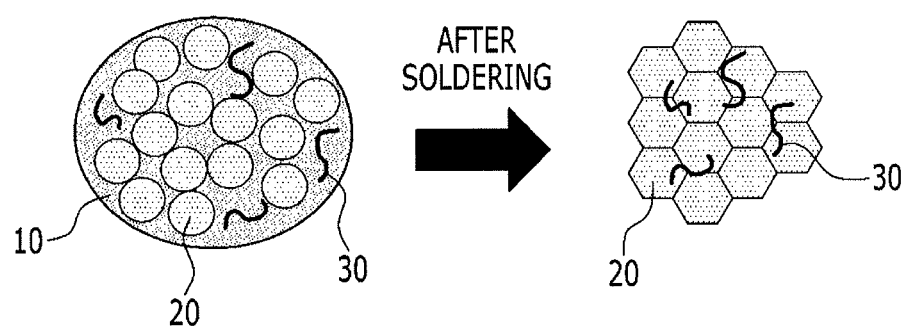
FIG. 1 is a schematic view of a solder paste containing a flux composition according to an exemplary embodiment of the present invention before and after soldering.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Advantages and features of the present invention and methods to achieve them will be elucidated from exemplary embodiments described below in detail with reference to the accompanying drawings. However, the present invention is not limited to the exemplary embodiment disclosed herein but will be implemented in various forms. The exemplary embodiments make disclosure of the present invention thorough and are provided so that those skilled in the art can easily understand the scope of the present invention. Therefore, the present invention will be defined by the scope of the appended claims. Like reference numerals throughout the description denote like elements.

Therefore, in order to avoid obscure interpretation of the present invention, a detailed description of technologies well known in the art will be omitted in exemplary embodiments. Unless otherwise defined, all terms (including technical terms and scientific terms) used in the present specification may be used as the general meaning commonly understood by those skilled in the art to which the present invention pertains. Throughout the present specification, unless explicitly described to the contrary, the word "comprise" and variations such as "comprises" or "comprising" will be understood to imply the inclusion of stated elements but not the exclusion of any other elements. Unless explicitly described to the contrary, a singular form includes a plural form in the present specification.

A soldering flux composition according to an exemplary embodiment of the present invention contains a resin, a solvent, and carbon particles.

The soldering flux composition according to the exemplary embodiment of the present invention contains the carbon particles, thereby making it possible to suppress growth of a grain boundary of a solder and corrosion of a surface and improve strength using a peening phenomenon of the carbon particles.

FIG. 1 is a view illustrating a schematic state of a solder paste containing the soldering flux composition according to the exemplary embodiment of the present invention before and after soldering. Before soldering, a flux 10, a solder 20, and carbon particles 30 are dispersed in the solder paste. The solder 20 is dissolved to form a shape and the flux 10 is vaporized by the soldering. At this time, the residual carbon particles are dispersed in the solder 20.

Figure 2:
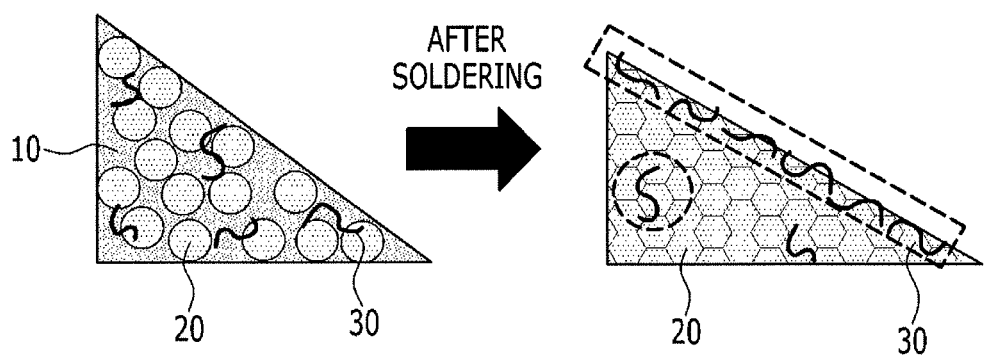
FIG. 2 is a schematic view of a solder paste containing a flux composition according to an exemplary embodiment of the present invention before and after soldering.

FIG. 2 is a view illustrating a schematic state of a solder paste containing the soldering flux composition according to the exemplary embodiment of the present invention before and after soldering. Similarly to the solder paste illustrated in FIG. 1, before soldering, a flux 10, a solder 20, and carbon particles 30 are dispersed in the solder paste. The solder 20 is dissolved to form a shape and the flux 10 is vaporized by the soldering. At this time, some of the carbon particles 30 are dispersed in the solder, and others are floated to the surface of the solder 20 by flow of the flux 10 to thereby be formed on the surface of the solder 20. The carbon particles 30 existing in a solder 20 alloy serve to improve mechanical strength of the alloy, and the carbon particles 30 existing on the surface of the solder 20 serve to suppress oxidation and corrosion, and suppress migration from occurring.

Hereinafter, each component of the soldering flux composition will be described.

First, as the resin, a resin used in a general flux composition may be used. In detail, a rosin based material or a resin based material may be used.

As the rosin based material, there are rosin and rosin derivatives, and as the resin based material, there are an acrylic resin, a styrene-maleic acid resin, an epoxy resin, a urethane resin, a polyester resin, a phenoxy resin, a terpene resin, and the like.

More specifically, as the rosin, tall oil rosin, gum rosin, wood rosin, or the like, may be used, and as the rosin derivative, hydrogenated rosin, polymerized rosin, non-uniform rosin, acrylic acid modified rosin, maleic acid modified rosin, or the like, may be used. As the acrylic resin, there is a polymer or copolymer of a monomer selected from (meth)acrylic acid, itaconic acid, maleic acid, crotonic acid, octyl (meth)acrylate, nonyl (meth)acrylate, decyl (meth)acrylate, undecyl (meth)acrylate, dodecyl (meth)acrylate, tridecyl (meth)acrylate, tetradecyl (meth)acrylate, lauryl (meth)acrylate, stearyl (meth)acrylate, methyl (meth)acrylate, ethyl (meth)acrylate, butyl (meth)acrylate, hexyl (meth)acrylate, and propyl (meth)acrylate.

The carbon particles may suppress growth of the grain boundary of the solder and corrosion of the surface and improve strength using a peening phenomenon. As the carbon particles, any carbon particle may be used without limitation as long as it is in a powder form. In detail, as the carbon particles, carbon nanotubes, graphene, fullerenes, nanodiamond, carbon black, or a combination thereof may be used. In more detail, graphene oxide (GO) may be used.

Any solvent may be used without limitation as long as the flux and the carbon particles may be uniformly dispersed therein. In detail, as the solvent, isopropyl alcohol, ethanol, acetone, toluene, xylene, ethyl acetate, ethylcellosolve, butylcellosolve, glycol ether, hexyldiglycol, (2-ethylhexyl) diglycol, phenyl glycol, butyl carbitol, octanediol, α-terpineol, β-terpineol, tetraethylene glycol dimethyl ether, trimellitic acid tris(2-ethylhexyl), sebacic acid bis(2-ethylhexyl), or a combination thereof may be used.

The flux composition according to the exemplary embodiment of the present invention may contain from about 30 wt % to about 50 wt % (e.g., about 30 wt %, 33 wt %, 35 wt %, 37 wt %, 40 wt %, 43 wt %, 45 wt %, 47 wt %, or about 50 wt %) of the resin and from about 0.5 wt % to about 30 wt % (e.g., about 0.5 wt %, 1 wt %, 5 wt %, 10 wt %, 15 wt %, 20 wt %, 25 wt %, 29 wt %, or about 30 wt %) of the carbon particles, the remainder being the solvent. In the above-mentioned range, mechanical/electrical properties may be further improved by adding the carbon particles. In detail, the flux composition may contain 30 to 40 wt % (e.g., about 30 wt %, 31 wt %, 32 wt %, 33 wt %, 34 wt %, 35 wt %, 36 wt %, 37 wt %, 38 wt %, 39 wt %, or about 40 wt %) of the resin and 1 to 30 wt % (e.g., about 1 wt %, 2 wt %, 5 wt %, 10 wt %, 15 wt %, 20 wt %, 25 wt %, 29 wt %, or about 30 wt %) of the carbon particles, the remainder being the solvent. In more detail, the flux composition may contain from about 30 wt % to about 40 wt % (e.g., about 30 wt %, 31 wt %, 32 wt %, 33 wt %, 34 wt %, 35 wt %, 36 wt %, 37 wt %, 38 wt %, 39 wt %, or about 40 wt %) of the resin and from about 10 wt % to 30 wt % (e.g., about 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or about 30 wt %) of the carbon particles, the remainder being the solvent.

A preparation method of a soldering flux composition according to an exemplary embodiment of the present invention includes: mixing a flux with a solvent to prepare a liquid phase mixture; preparing carbon particles having an activated surface; and dispersing the carbon particles in the liquid phase mixture.

Since a detailed description of the flux, the solvent, and the carbon particles is the same as that described above, an overlapping description thereof will be omitted.

Hereinafter, each step will be described in detail.

First, the liquid phase mixture is prepared by mixing the flux and the solvent.

Next, the carbon particles having the activated surface are prepared. In order to improve dispersibility of the carbon particles, the surfaces of the carbon particles are activated. In this case, as a specific method of activating the surfaces of the carbon particles, a method of exposing the surfaces of the carbon particles to UV light or radiation, a method of performing acid treatment on the surfaces of the carbon particles, or a method of performing ultrasonic treatment on the surfaces of the carbon particles may be used.

Then, the carbon particles are dispersed in the liquid phase mixture.

As a dispersion method, a milling process may be used.

A solder mixture according to an exemplary embodiment of the present invention may contain the flux composition as described above and a solder.

Since a description of the flux composition and a preparation method thereof are the same as those described above, an overlapping description thereof will be omitted.

As the solder, a metal known as a lead-free solder may be used without limitation. In detail, a tin-silver-copper alloy, a tin-silver alloy, a tin-copper alloy, a tin-bismuth alloy, or a tin-indium alloy may be used. In some embodiments, the solder may not contain carbon.

The solder mixture may be prepared as a solder paste by mixing the above-mentioned liquid phase flux composition with solder powder or be prepared as a solder wire by drying the liquid phase flux composition and extruding the flux composition together with the solder.

It is significantly difficult to disperse carbon particles in the solder due to a specific gravity difference between the solder and the carbon particles, and phase separation is generated between the carbon particles and the solder during the process. However, in the solder mixture of the present invention, since the carbon particles are dispersed in the flux composition, even though the solder mixture is prepared by mixing the flux composition with the solder, the carbon particles may be suitably dispersed, and phase separation between the carbon particles and the solder is not generated.

A soldering method according to an exemplary embodiment of the present invention includes: printing the solder mixture as described above on a circuit board; curing the solder mixture; coating an electrolyte resin on a surface of the cured solder mixture; and performing heat treatment on the cured solder mixture.

When the solder mixture is cured, while a flux component is volatilized in the air, the carbon particles are released to the outside of the solder. According to the exemplary embodiment of the present invention, it is possible to prevent the carbon particles from being released to the outside of the solder by coating the electrolyte resin on the surface of the cured solder mixture.

Figure 3:
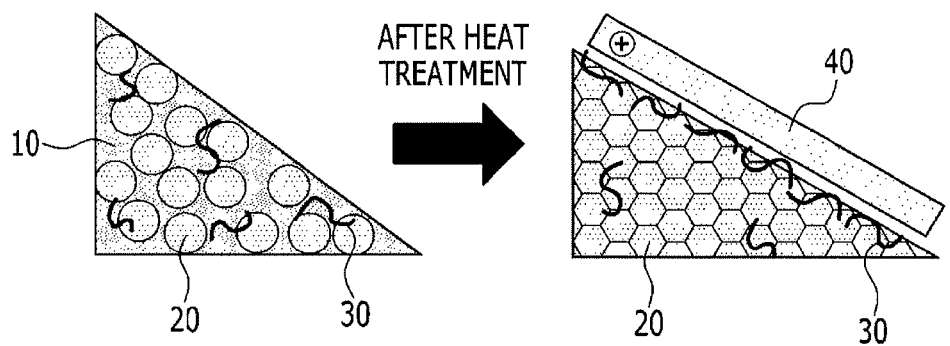
FIG. 3 is a schematic view illustrating coating an electrolyte resin in a soldering method according to an exemplary embodiment of the present invention.

The principle as described above is schematically illustrated in FIG. 3. The carbon particles 30 to be released from the inside of the solder 20 to the outside of the solder 20 are blocked by the electrolyte resin 40, thereby remaining in the solder 20. Particularly, in general, the carbon particles are negatively (−) charged, and in the case in which the electrolyte resin is positively (+) charged, the carbon particles and the electrolyte resin are bound to each other by electrostatic attraction, such that the carbon particles 30 released to the outside of the solder 20 may be further decreased.

Hereinafter, each step of the soldering method will be described.

First, the above-mentioned solder mixture is printed on the circuit board.

The circuit board is not particularly limited, and more specifically, the circuit board may be a printed circuit board (PCB). As a printing method of the solder mixture, a general printing method may also be used. In some cases, a screen printing process may be used. After printing the solder mixture, an object to be electrically connected, for example, a chip component may be mounted.

Next, the solder mixture is cured. In this case, the solder mixture may be cured at from about 200° C. to 250° C. (e.g., about 200° C., 210° C., 215° C., 220° C., 225° C., 230° C., 235° C., 240° C., 245° C., or about 250° C.) for from about 5 hours to about 6 hours (e.g., about 5 hours, 5.5 hours or about 6 hours). In the above-mentioned range, the solder mixture may be sufficiently cured.

Then, the electrolyte resin is coated on the surface of the cured solder mixture. As the electrolyte resin, a positively (+) charged electrolyte resin may be used. In detail, poly(diallyldimethylammonium chloride), poly(allylamine), poly(ethyleneimine), or poly(acrylamide-co-diallyldimethylammonium) may be used. The electrolyte resin may be coated at a thickness of from about 100 μm to 500 μm (e.g., about 100 μm, 130 μm, 150 μm, 200 μm, 250 μm, 270 μm, 300 μm, 350 μm, 400 μm, 410 μm, 430 μm, 450 μm, 480 μm, or 500 μm). In the case in which a coating thickness is excessively thin, the carbon particles may be released to the outside of the solder. In the case in which the coating thickness is excessively thick, electrical performance of a solder joint may be deteriorated. Therefore, the electrolyte resin may be coated so as to have the above-mentioned thickness.

The soldering method may further include, after the coating of the electrolyte resin, washing the surface of the solder mixture. This is to remove an electrolyte resin residue that does not form a thin film but remains on the surface through a washing process. When the electrolyte resin residue is removed, only an electrolyte resin coating layer strongly bound to the carbon particles by static electricity through micro charges remains.

Next, a cured solder compound is subjected to heat treatment. In detail, the heat treatment may be performed at from about 50° C. to 100° C. (e.g., about 50° C., 60° C., 70° C., 80° C., 90° C., or about 100° C.) for from about 10 minutes to about 3 hours (e.g., about 10 minutes, 30 minutes, 1 hour, 1.5 hours, 2 hours, 2.5 hours, or about 3 hours).

Hereinafter, preferable Examples and Comparative Examples of the present invention will be described in detail. However, the following Examples are provided as only preferable examples of the present invention. Therefore, the present invention is not limited thereto.

Preparation Example—Preparation of Flux Composition

Preparation Example 1

As a resin, 5 g of a rosin based flux (MG CHEMICALS) was dissolved in 5 g of isopropyl alcohol to thereby be liquefied. 0.1 g of graphene oxide was exposed to UV light, thereby activating a surface thereof. The graphene oxide was dispersed in the rosin and isopropyl alcohol, thereby preparing a flux composition.

Preparation Example 2

A flux composition was prepared in the same manner as in Preparation Example 1 except for using an acrylic acid modified flux as the resin.

Preparation Example 3

A flux composition was prepared in the same manner as in Preparation Example 1 except for dispersing 0.05 g of graphene oxide.

Comparative Preparation Example 1

A flux composition was prepared in the same manner as in Preparation Example 1 except that graphene oxide was not dispersed.

Example—Preparation of Solder Paste and Soldering

Examples 1 to 3

A solder paste was prepared by mixing 10 g of each of the flux compositions prepared in above-mentioned Preparation Examples 1 to 3 and 40 g of SAC305 alloy solder.

After printing the solder paste on a printed circuit board (PCB) and mounting a chip on the PCB, the solder mixture was cured. Poly(diallyldimethylammonium chloride) (PDDA) was coated on a surface of the cured solder mixture at a thickness of 300 μm. Thereafter, the surface was washed, and subjected to heat treatment at 80° C. for 1 hour.

Mechanical strength of the solder and a degree of migration were measured by the following methods, and the results were illustrated in the following Table 1.

Measurement Method of Mechanical Strength: A bonding strength decrease rate was measured by measuring shear strength of a soldering element before and after performing a durability test for 1000 cycles and 1500 cycles, respectively, using a dedicated apparatus for measuring solder bonding strength.

Degree of Migration: Whether or not ion migration was generated and an insulation resistance were evaluated by performing high-temperature and high-humidity durability test under a voltage-applied condition, thereby measuring a degree of migration.

Comparative Example 1

Soldering was performed in the same manner as in Example 1 described above except for using the flux composition prepared in Comparative Preparation Example 1 described above.

Comparative Example 2

A solder paste was prepared by mixing 10 g of the flux composition prepared in the Preparation Example 1 described above and 40 g of SAC305 alloy solder.

After printing the solder paste on a printed circuit board (PCB) and mounting a chip on the PCB, the solder mixture was cured. Heat treatment was performed at 80 for 1 hour without coating PDDA.

TABLE 1

| Classification | Example 1 | Example 2 | Example 3 | Comparative Example 1 | Comparative Example 2 |
|---|---|---|---|---|---|
| Bonding Strength Decrease Rate (%) after Durability Evaluation (1000 cycles) | −9% | −12% | −11% | −14% | −15% |
| Bonding Strength Decrease Rate (%) after Durability Evaluation (1500 cycles) | −20% | −30% | −28% | −43% | −41% |
| Ion Migration | no | no | no | no | no |
| Insulation Resistance (Ω) | $10^{11}$ | $10^{10}$ | $10^{10}$ | $10^{9}$ | $10^{9}$ |

As illustrated in Table 1, it may be appreciated that the flux compositions of Examples 1 to 3 were excellent in view of mechanical durable strength, and suppression of ion migration of the solder.

The present invention is not limited to the exemplary embodiments disclosed herein but will be implemented in various forms. Those skilled in the art to which the present invention pertains will appreciate that various modifications and alterations may be made without departing from the spirit or essential feature of the present invention. Therefore, it should be understood that the above-mentioned embodiments are not restrictive but are exemplary in all aspects.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "interior", "exterior", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A soldering method comprising:
   printing a solder mixture of on a circuit board;
   curing the solder mixture;
   coating an electrolyte resin on a surface of the cured solder mixture; and performing heat treatment on the cured solder mixture,
   wherein the curing of the solder mixture is performed at from about 200° C. to about 250° C. for from about 5 hours to about 6 hours and the electrolyte resin is poly(diallyldimethylammonium chloride), poly(allylamine), poly(ethyleneimine), or poly(acrylamide-co-diallyldimethylammonium).

2. The soldering method of claim 1, wherein in the coating of the electrolyte resin, the electrolyte resin is coated at a thickness of from about 100 μm to about 500 μm.

3. The soldering method of claim 1, further comprising, after the coating of the electrolyte resin, washing the surface of the solder mixture.

4. The soldering method of claim 1, wherein:
the heat treatment is performed at from about 50° C. to 100° C. for from about 10 minutes to about 3 hours.

5. The soldering method of claim 1, wherein the solder mixture comprises a resin, a solvent and carbon particles.

6. The soldering method of claim 5, wherein the solder mixture further comprises a solder.

* * * * *